Feb. 11, 1969 D. F. ALLISON 3,427,212

METHOD FOR MAKING FIELD EFFECT TRANSISTOR

Original Filed Dec. 18, 1963

INVENTOR.
David F. Allison
BY Flehr, Hohbach, Test, Albritton & Herbert
Attorneys United States Patent Office 3,427,212
Patented Feb. 11, 1969

3,427,212
METHOD FOR MAKING FIELD EFFECT TRANSISTOR

David Frank Allison, Los Altos, Calif., assignor to Signetics Corporation, Sunnyvale, Calif., a corporation of California Original application Dec. 18, 1963, Ser. No. 331,547, now Patent No. 3,295,030, dated Dec. 27, 1966. Divided and this application Nov. 14, 1966, Ser. No. 593,778
U.S. Cl. 148—187 3 Claims
Int. Cl. H01l 7/32

ABSTRACT OF THE DISCLOSURE

A method of forming a field-effect transistor by forming adjacent a surface of a semiconductor body of a first conductivity type two gate regions of a second conductivity type leaving a channel of the first conductivity type extending to the same surface of the body therebetween, diffusing an impurity of the first conductivity type into the body from the same surface such that the width of the upper portion of the channel is controllably increased and applying contacts.

This application is a division of application Ser. No. 331,547, filed Dec. 18, 1963 now U.S Patent No. 3,295,030.

This invention is directed to a method for making a field effect transistor and more particularly to a method for making a field effect transistor in which the channel width can be precisely controlled.

Although field effect transistors have been known for a number of years, it has been very difficult to produce field effect transistors because the resistivity of the channel and the width of the channel required in such transistors must be controlled very precisely. This has been very difficult to do. Various techniques have been utilized such as of alloying in a slice of silicon of a controlled thickness and the use of epitaxial and double diffusion techniques. For example, with one double diffusion technique presently used, the process is started with a block of silicon of the desired P or N resistivity. Assuming that the P resistivity of silicon is used, there is next diffused into the block or body an N layer to a precise depth with a very closely controlled doping level. On top of this N layer, there is diffused another P layer which cuts across the N region or layer to provide a channel. This method has proved to be relatively satisfactory. However, it is necessary to precisely control the diffusion steps. In evaluating field effect transistors, various figures of merit are utilized. One of them is called the $g_m$ which is the transconductance of the field effect This transconductance is proportional to the doping in the channel which can be called sigma ($\sigma$) times the width of the channel which can be called $a$ divided by the length of the channel which can be called L. Thus, the transconductance $g_m$ can be expressed in the following formula:

$$g_m \frac{\sigma a}{L}$$

In general, it can be stated that to obtain the most desirable $g_m$, the channel should have a small dimension L which can be the width of the channel and a maximum dimension $a$ which is the depth of the channel. Thus, to make the conductivity of the channel high, the product $\sigma a$ should be large. Generally speaking, when other figures of merit for field effect transistors are evaluated, it is desirable to have $a$ be quite small with $\sigma$ being very large. Utilizing the technique described above, the $a$ dimension with present techniques can be controlled so that the channel is very thin or, in other words, has very little depth, i.e., for example, less than a micron. This also allows $\sigma$ to become large. The dimension L is the width of the channel can be made as small as possible by closely controlled photolithographic techniques presently being used. There still is, however, considerable difficulty in controlling the dimension L as well as the dimension $a$ in the channels and in particular there is difficulty utilizing such techniques with integrated circuits. There is, therefore, a need for a new and improved field effect transistor and method in which the channel dimensions can be closely and readily controlled.

In general, it is an object of the present invention to provide a field effect transistor and method in which the channel dimensions can be closely controlled.

Another object of the invention is to provide a field effect transistor and method of the above character which is particularly adapted for use in integrated circuitry.

Another object of the invention is to provide a field effect transistor and method of the above character in which different geometries may be utilized.

Additional objects and features of the invention will appear from the following description in which the preferred embodiment is set forth in detail in conjunction with the accompanying drawings.

Referring to the drawings.

Figure 1A:
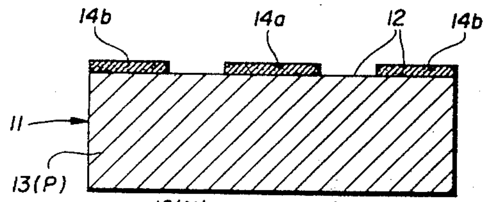
FIGURES 1A, 1B, 1C and 1D show the steps utilized in forming a field effect transistor in accordance with my method.
Figure 1B:
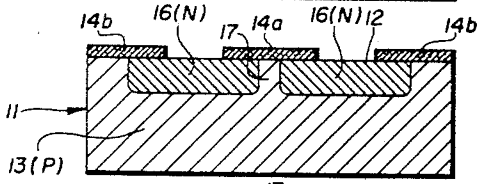
Figure 1C:
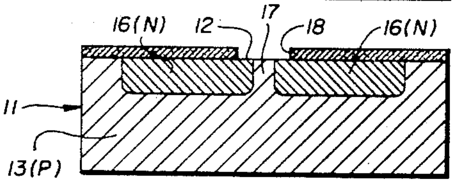

In general, my field effect transistor consists of a semiconductor body which has a surface. The body contains a region of one conductivity type and a region of an opposite condivity type disposed in the region of one conductivity type so that a jucntion is formed which extends to the surface. Another region of said one conductivity type is disposed in the region of opposite conductivity and forms a junction which also extends to the surface of the body. The body is also provided with a channel of said one conductivity type which extends through the region of opposite conductivity and serves to join the regions of one conductivity. Contact means is provided which is secured to each of the regions.

In FIGURES 1A, 1B, 1C and 1D, I have shown the method by which my field effect transistor is constructed. I have shown a body 11 of a suitable semiconductor material such as silicon which is provided with a surface 12 which is preferably planar. All of the body 11 or a substantial portion of the body 11 can be doped by diffusing either an N-type or a P-type dopant through one or more surfaces of the body 11 to provide a region 13 of one conductivity as, for example, P-type conductivity as shown in the drawings. During diffusion of the donor or acceptor impurities which serve as the P- and N-type dopants into the semiconductor body, there is formed, at elevated temperatures in an oxidizing atmosphere, an oxide layer which, for example, if the semiconductor body 11 is silicon, can be an oxide layer consisting chiefly of silicon dioxide or of a disproportionated silicon suboxide, depending upon the temperature and conditions of formation of the oxide layer.

After the oxide layer has been formed on the surface 12, substantially all of the oxide layer is removed by well known chemical etching techniques to leave residual portions 14*a* and 14*b* of the oxide layer in a predetermined position on the surface 12 and, as indicated, in a generally central position. The area of the surface 12 covered by the portion 14*a* of the oxide layer should be closely controlled because the actual dimensions of this portion 14*a* have a very definite bearing upon the size of the channel which is formed as hereinafter described. This does not present any difficulty because the area covered by the portion 14*a* can be very closely controlled by photo-engraving techniques which are well known to those skilled in the art.

After this has been completed, a region of an opposite conductivity type is formed in the region of the one conductivity as, for example, by diffusing an N-type dopant into the surface 12 to form an annular N-type layer or region 16. However, the diffusion is mased by the oxide layer portions 14*a* and 14*b* so that a closed figure such as an annulus or a closed rectangle having an open center is formed. It should be noted that as the dopant diffuses into the semiconductor body, it will normally diffuse laterally as well as downwardly and normally will diffuse laterally as far as it diffuses downwardly to provide an annular region 16. For the formation of the channel hereinafter described in detail, it is desirable that the lateral diffusion not join under the oxide portion 14*a* so that a channel 17 remains of a closely controlled dimension immediately underlying the oxide portion 14*a*. Thus, it can be seen by precisely determining the size of the oxide portion 14*a* and the time of diffusion for the region 16, it is possible to provide a downwardly extending channel 17 with closely controlled dimensions. The amount that the region 16 is disposed laterally under the oxide portion 14*b* is not particularly important. However, they will normally extend laterally as far as they do under the oxide portion 14*a*.

After the region 16 of opposite conductivity has been formed, the oxide portions 14*a* and 14*b* are removed by chemical etching. Thereafter, another oxide layer is regrown on the surface 12 of the semiconductor body 11 in the manner hereinbefore described. A hole 18 of closely controlled dimension is then etched into the oxide layer 17 by photoengraving techniques. It will be noted that the hole 18 is approximately the same size as the oxide portion 14*a* which was removed.

Figure 1D:
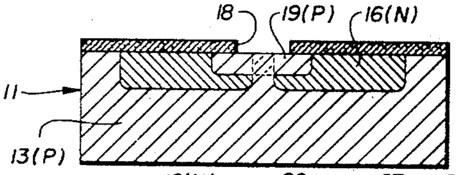

After this has been completed, a region 19 of the same conductivity as the first region which was formed in the body is formed in the region 16 and extending across the channel 17 in a suitable manner by diffusing a P-type dopant through the surface 12 exposed through the opening 18. As shown in FIGURE 1D, the P-type dopant will diffuse laterally under the oxide layer 17 at the same time that it diffuses downwardly and it will generally diffuse the same distance laterally as it diffuses downwardly. Thus, a P-type region 19 is formed in the N-type region 16 to provide a junction 21 which extends to the surface 12 and which is surrounded by the N-type region 16. The N-type region 16 also forms a junction 22 which extends to the surface 12 and which is surrounded by the region 13. As can be seen from FIGURE 1E, the channel 17 has a cross-sectional dimension parallel to said surface 12 which is substantially less than a corresponding parallel cross-sectional dimension of said region 19. The region 19 has a dimension parallel to the surface 12 which is substantially less than the corresponding parallel dimension of the region 16 and a dimension perpendicular to the surface 12 which is less than the corresponding perpendicular dimension of the region 16.

Figure 1E:
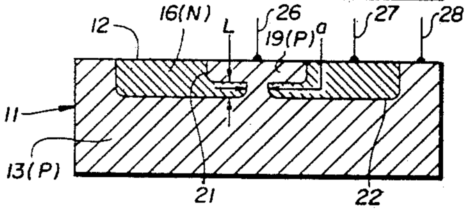
FIGURE 1E is a cross-sectional view taken along the line 1E—1E in FIGURE 2 and shows a field effect transistor incorporating my invention.

As can be seen from FIGURE 1E, the formation of the region 19 of one conductivity or, in other words, of a P-type, is connected by the channel 17 also of said one conductivity to the region 13 of said one conductivity so that, in effect, a channel 17 of closely controlled dimensions is provided extending through the region 16 of other conductivity to thereby provide a precisely controlled channel whereby a greatly improved field effect transistor can be obtained because of the precisely controlled channel width and depth.

Means is provided for forming contact with the various regions of the semiconductor device or transistor structure, and thus leads 26, 27 and 28 are provided which are secured to the regions 19, 16 and 13, respectively, and which in the arrangement shown in the drawings, the region 13 serves as the drain; region 16 as the gate; and region 19 as the source of the field effect transistor.

As explained previously, the transconductance or $g_m$ of the field effect transistor is proportional to $a/L$. With the arrangement shown in FIGURE 1E, L corresponds to the depth of the channel 17 as shown in FIGURE 1E, whereas *a* corresponds to the width of the channel 17. With the method shown, the dimension L can be made very small. For example, the layer 16 can have a depth controlled to a few microns or even less than a micron with the other layer 19 being formed thereafter having a smaller depth to provide an L dimension which can be one-half a micron or less. With such a small L dimension, the transconductance of the field effect is greatly increased. The *a* dimension of the channel can also be precisely controlled by precisely determining the size of the oxide portion 14*a*.

Also, from the construction, it can be seen that the resistivity of the channel 17 is determined by the bulk of the material of the body, i.e., the material forming the region 13, whereas in conventional field effect transistors, the resistivity of the channel is determined by the resistivity of the diffused material.

Figures 2, 3:
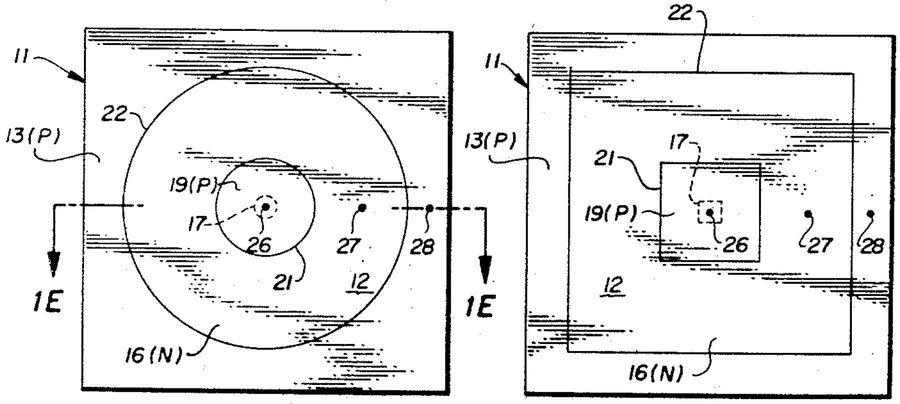
FIGURE 2 is a top plan view of my field effect transistor utilizing circular geometry.
FIGURE 3 is a top plan view similar to FIGURE 2 of my field effect transistor but using rectangular geometry.

Although in FIGURES 1D and 2 I have shown a field effect transistor or semiconductor structure which utilizes a circular geometry in which the neck or channel 17 is circular, a rectangular geometry such as that shown in FIGURE 3 can also be used advantageously.

Although the construction hereinbefore described can be utilized for constructing field effect transistors of any type, the method herein disclosed particularly lends itself to use with integrated circuits because the diffusion steps which are required for making the field effect transistor can also be utilized for making other devices in the integrated circuitry at the same time.

It is apparent from the foregoing that I have provided a new and improved field effect transistor and method which makes possible a precisely controlled channel. In addition, I have provided a field effect transistor and method which can be readily and economically formed by utilization of conventional techniques.

I claim:

1. In a method for forming a field effect transistor utilizing a semiconductor body, forming a region of one conductivity type in the body, forming a second region of opposite conductivity type in the body to form a junction extending to the surface of the body and to provide a channel of said one conductivity extending to the surface within the confines of said region of opposite conductivity, forming a region of said one conductivity in said region of opposite conductivity in direct contact with said channel of said one conductivity to form a junction with said region of opposite conductivity which extends to the surface and is surrounded by said region of opposite conductivity and forming contacts on said regions.

2. A method as in claim 1 wherein said regions are formed by diffusion and wherein said second named region of said one conductivity is diffused to a depth substantially less than the depth of the region of opposite conductivity.

3. In a method for forming a field effect transistor in a body of semiconductor material having a surface, diffusing a region of one type conductivity into the semiconductor body, forming a mask on the surface of the body having precisely controlled dimensions, diffusing a region of opposite conductivity into the body through the surface on which the mask is disposed to provide a junction which extends to the surface of the body and in which a channel is formed in said one region extending up to the surface and underlying the mask, removing the mask, applying an additional mask so that it overlies the surface and exposes the channel and a portion of said region of opposite conductivity adjacent said channel, diffusing a third region of said one conductivity into said body which is in registration with said channel to a depth which is less than the depth of said second region to form a junction which extends to the surface and is surrounded by said second region, removing the additional mask from the body and forming electrical contacts in contact with said regions.

References Cited

UNITED STATES PATENTS 3,183,128 5/1965 Leistiko et al. ------ 148—187 X

L. DEWAYNE RUTLEDGE, *Primary Examiner.*

R. LESTER, *Assistant Examiner.*

U.S. Cl. X.R.

148—186, 189; 29—571; 317—235